(12) United States Patent
Curry et al.

(10) Patent No.: US 11,385,268 B2
(45) Date of Patent: Jul. 12, 2022

(54) BYPASS DETECTION MODULES AND RELATED DEVICES AND METHODS

(71) Applicant: Sensus Spectrum, LLC, Morrisville, NC (US)

(72) Inventors: James Edward Curry, Covington, LA (US); Michael Ray Brown, Mandeville, LA (US); Matthew James Savarda, Wake Forest, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 128 days.

(21) Appl. No.: 16/809,867

(22) Filed: Mar. 5, 2020

(65) Prior Publication Data

US 2020/0284827 A1 Sep. 10, 2020

Related U.S. Application Data

(60) Provisional application No. 62/813,875, filed on Mar. 5, 2019.

(51) Int. Cl.
*G01R 22/06* (2006.01)
*G01R 11/24* (2006.01)

(52) U.S. Cl.
CPC ............ *G01R 22/066* (2013.01); *G01R 11/24* (2013.01)

(58) Field of Classification Search
CPC .... G01R 22/066; G01R 11/24; G01R 22/061; G01R 22/068; Y04S 20/30; G06Q 50/06
See application file for complete search history.

(56) References Cited

U.S. PATENT DOCUMENTS

| | | |
|---|---|---|
| 2008/0258709 A1 | 10/2008 | Shuey |
| 2013/0293390 A1* | 11/2013 | Le Buhan .............. G01D 4/004 340/870.02 |
| 2015/0241488 A1* | 8/2015 | Sonderegger .......... G06Q 50/06 702/65 |
| 2015/0247900 A1 | 9/2015 | Shuey et al. |
| 2016/0352142 A1* | 12/2016 | Hughes ............... H02J 13/0006 |

FOREIGN PATENT DOCUMENTS

EP 3009851 A1 * 4/2016 .......... G01R 22/066
WO WO 2015/130823 9/2015

OTHER PUBLICATIONS

International Search Report and Written Opinion, PCT/US2020/021102, dated Jun. 8, 2020.

* cited by examiner

*Primary Examiner* — Son T Le
*Assistant Examiner* — Dustin R Dickinson
(74) *Attorney, Agent, or Firm* — Stanek Lemon Crouse & Meeks, PA

(57) ABSTRACT

Bypass detection modules associated with a device are provided. The bypass detection module is configured to determine if one of more switches have been opened to remove service from a customer; monitor electrical characteristic associated with both a line side of the device and a load side of the device responsive to determining that one of more of the one or more switches have been opened to remove service from the customer; and determine a state of the device based on the monitored electrical characteristics.

11 Claims, 6 Drawing Sheets

FOR EACH LINE SIDE AND LOAD SIDE CONDITION CHECK RD STATE ON DISPLAY AND NOTE "OPEN" OR "LSS" OR "ALT" IN MATRIX BELOW.
DISCONNECT LOAD SIDE VARIAC FOR THE TEST TO AVOID DAMAGING THE VARIAC
BRIDGE LINE SIDE TO LOAD SIDE WITH A JUMPER CABLE AS INDICATED IN THE "BRIDGE" ROW
"A TO A" MEANS BRIDGE LINE A TO LOAD A ONLY
"C TO C" MEANS BRIDGE LINE C TO LOAD C ONLY
"AC TO AC" MEANS BRIDGE LINE A TO LOAD A AND LINE C TO LOAD C
"A TO C" MEANS BRIDGE LINE A TO LOAD C ONLY
"C TO A" MEANS BRIDGE LINE C TO LOAD A ONLY
"AC TO CA" MEANS BRIDGE LINE C TO LOAD A AND LINE A TO LOAD C

LOAD SIDE, EXTENSION CORD SCENARIO (BRIDGE LINE TO LOAD WITH A JUMPER CABLE)

| LINE SIDE P-P | | LOAD PLACEMENT | NONE | | | A+C | | | NONE | | | A+C | | | NONE | | | A+C | | | NONE | | | A+C | | |
|---|---|---|---|---|---|---|---|---|---|---|---|---|---|---|---|---|---|---|---|---|---|---|---|---|---|---|
| VOLTAGE | FREQUENCY | BRIDGE PHASE | A TO A | A TO C | A TO A | A TO A | C TO C | C TO C | A TO C | C TO C | C TO C | C TO A | A TO A | A TO AC | AC TO AC | AC TO AC | AC TO AC | A TO C | C TO C | C TO A | A TO C | C TO A | C TO A | AC TO CA | AC TO CA | AC TO CA |
| 216 | 60 | | OPEN | OPEN | LSS | LSS | LSS | LSS | LSS | LSS | LSS | OPEN | LSS | LSS | LSS | LSS | LSS | LSS | LSS | LSS | LSS | LSS | LSS | LSS | LSS | LSS |
| 240 | 60 | | OPEN | OPEN | LSS | LSS | LSS | LSS | LSS | LSS | LSS | OPEN | LSS | LSS | LSS | LSS | LSS | LSS | LSS | LSS | LSS | LSS | LSS | LSS | LSS | LSS |
| 264 | 60 | | OPEN | OPEN | LSS | LSS | LSS | LSS | LSS | LSS | LSS | OPEN | LSS | LSS | LSS | LSS | LSS | LSS | LSS | LSS | LSS | LSS | LSS | LSS | LSS | LSS |

OPEN = CONTINUOUS "OPEN" AND "NO LSS" ON LCD DISPLAY
LSS = CONTINUOUS "OPEN_S" AND "LSS" ON LCD DISPLAY
ALT = ALTERNATING "OPEN" TO "LSS" ETC ON LCD DISPLAY

FIG. 5

BYPASS DETECTION MODULES AND RELATED DEVICES AND METHODS

CLAIM OF PRIORITY

The present application claims priority to U.S. Provisional Application Ser. No. 68/813,875, filed on Mar. 5, 2019, entitled Bypass Detection Methods and Related Devices and Systems, the disclosure of which is hereby incorporated herein by reference as if set forth in its entirety.

FIELD

The present inventive concept relates generally to meters and, more particularly, to remote detection of meter parameters.

BACKGROUND

With the addition of communication circuits in all sorts of devices, for example, gas, electric and water meters, these devices can communicate with remote locations. Thus, maintenance and meter operations that traditionally had to be performed on site, can now largely be performed remotely. For example, conventional meters can include a remote disconnect capability, enabling the operator to activate or deactivate service remotely. In particular, electric meters, residential or commercial, are currently available with an integrated remote disconnect (RD) switch. The RD switch is configured to be opened and/or closed remotely via commands, for example, radio frequency (RF) commands, sent to the meter from a remote location. When a meter is opened, i.e. service is discontinued to a customer, for any reason, the meter is sometimes bypassed unlawfully using a variety of methods. Since a technician is not on site as often as he/she traditionally was, this unlawful bypass of the meter may go undetected. It is advantageous to a utility to know if a meter is being bypassed unlawfully for both safety reasons and cost ramifications.

SUMMARY

Some embodiments of the present inventive concept provide bypass detection modules associated with a device. The bypass detection module is configured to determine if one of more switches have been opened to remove service from a customer; monitor electrical characteristic associated with both a line side of the device and a load side of the device responsive to determining that one of more of the one or more switches have been opened to remove service from the customer; and determine a state of the device based on the monitored electrical characteristics.

In further embodiments, the monitored electric characteristics may be voltages and the bypass detection module may be further configured to monitor voltages associated with both a line side (VLine) of the device and a load side (VLoad) of the device responsive to determining that one of more of the one or more switches have been opened to remove service from the customer; and determine a state of the device based on the monitored voltages.

In still further embodiments, the bypass detection module may be further configured to provide an indication of an unlawful bypass as the state of the device if it has been determined that one of more of the one or more switches have been opened to remove service from the customer and a line side voltage is substantially equal to a load side voltage over a plurality of cycles.

In some embodiments, substantially equal may be when a line side voltage and a load side voltage being within twenty percent of one another.

In further embodiments, the plurality of cycles may include at least four cycles.

In still further embodiments, the bypass detection module may be further configured to provide an indication of an unlawful bypass as the state of the device if it has been determined that a load side voltage is below a predetermined threshold.

In some embodiments, the device may be an electric meter.

Related meters and methods are also provided.

BRIEF DESCRIPTION OF THE DRAWINGS

FIG. 5 is a table illustrating results when a switch is bypassed using a neighbor's power in accordance with some embodiments of the present inventive concept.

DETAILED DESCRIPTION

Figure 1:
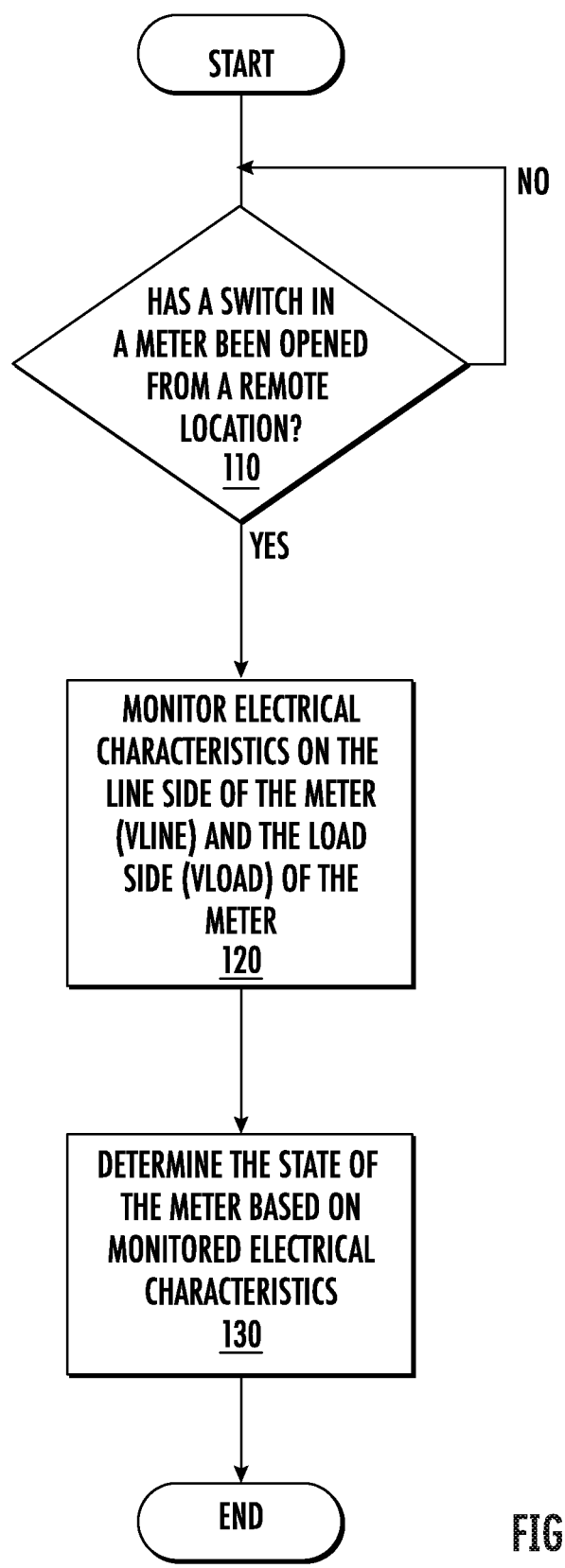
FIG. 1 is a flowchart illustrating operations for determining if a switch has been bypassed in a meter in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Although embodiments of the present inventive concept are discussed herein with respect to electric meters, specifically residential electric meters, embodiments of the present inventive concept are not limited thereto. For example, embodiments of the present inventive concept can be applied to any type of meter and the meter can be residential or commercial without departing from the scope of the present inventive concept.

As used herein, in some embodiments a "single bypass" generally refers to any condition which causes the voltage, or a portion thereof, of a phase on the line-side of the meter to appear on the corresponding phase of the load side of the meter." Similarly, a "double bypass" refers to a condition that exists when both phases of the meter are bypassed. It will be understood that some meters only have a single active phase and, thus, cannot be double bypassed in a meaningful way. In some embodiments, a bypass may be detected based on the absence of a voltage on a load side of the meter when a switch or relay is open as will be discussed further below.

Some embodiments of the present inventive concept are directed to methods, systems and devices that may be used to detect an "unlawful bypass." An "unlawful bypass" refers to any configuration of the meter that allows a user to obtain service (water, gas, electric) without usage associated with that service being logged by the meter. Thus, in a physical sense, the meter is physically bypassed to avoid incurring charges associated with the service. However, it will be understood that embodiments of the present inventive concept are not limited to detecting unlawful bypass situations and may be used to detect meters that are not operating in an expected manner.

Bypass detection is generally a configurable feature of remote disconnect (RD) meters that allows the meter to detect or ignore the presence of a physical bypass or bridge between a line-side of the meter and a load-side of the meter or between the line-side of the meter and a nearby building's electricity via, for example, an extension cord. An RD meter generally uses voltages and/or currents to infer the position of a relay (switch).

As used herein, "line side" refers to a side of the device, for example, the meter, where the wires, coming from a power source that deliver the electricity, are connected. In other words, the line side of the device/is the side where the power comes in from the source. The "load side" refers to the side of the meter device (meter) that is consuming the power, i.e. the residence, building of the like. An electrical "load" is an electrical component or portion of a circuit that consumes electricity.

As discussed above, meters generally have a bypass detection feature. This bypass detection feature can be disabled, not unlike other features in the meter. When bypass detection is disabled within the meter, the meter generally will not flag a detected single bypass as a load side sense (LSS) condition, nor will it send an alarm when it detects such a condition. However, a meter generally always flags a detected double bypass as an "LSS", "unsafe to close" condition, though it may not send an alarm when such a condition is detected. An alarm may not be sent because a double bypass condition appears identical to a closed relay, and the proper operation of the autocorrect feature of the meter depends on being able to support closed relays that failed to open. If the meter was commanded to open the relay and then the meter detects voltage matches on all active phases, then it will send an alarm. When bypass detection is enabled within the meter, the meter will flag a single bypass as an LSS condition and send an alarm when such a condition is detected. Thus, for one of skill in the art, there are many ways a customer can unlawfully bypass a meter without this bypass being detected using conventional bypass detection methods. As discussed above, use of RD meters allow technicians to monitor/control these meters from a remote location, these conditions may go unnoticed for longer periods of time.

Thus, some embodiments of the present inventive concept combine conventions of bypass detection with a position sensing component to improve detection of unlawful bypass of meters. In particular, some embodiments of the present inventive concept break down bypass detection into a load side sense (LSS) component as discussed above and a position sensing component. The LSS component is generally responsible for setting the LSS indication when voltage is present on the load side of the meter, preventing closure on a bypass using remote disconnection and flagging a warning if RD closure is attempted when a bypass condition exists. The position sensing component is responsible for flagging an error when a bypass condition is detected. Accordingly, some embodiments of the present inventive concept use these two components to provide improved bypass detection in meters from a remote location as will be discussed further below with respect to FIGS. 1 through 5.

Figure 2A:
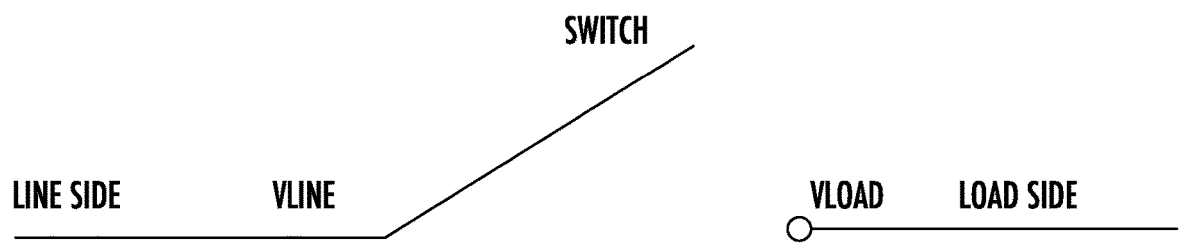
FIGS. 2A and 2B illustrate a single switch opened by the utility and bypassed at the customer site, respectively, in accordance with some embodiments of the present inventive concept.
Figure 2B:
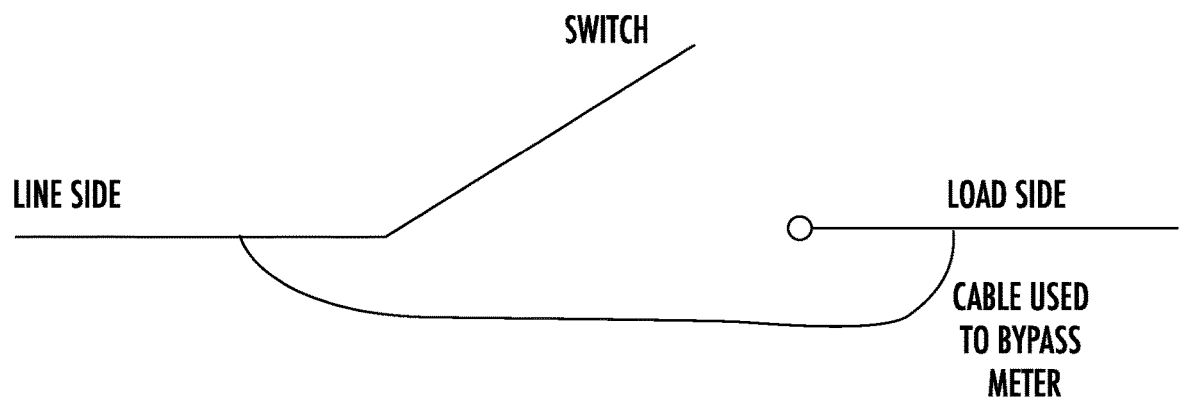

Referring now to FIG. 1, operations for monitoring a switch opened from a remote location will now be discussed. It will be understood that service to a meter may be discontinued by opening one or more switches between the load side and line side of the meter, thus, essentially cutting off the flow of electricity to the load, i.e., the residence, office building or the like. This open switch situation is illustrated simply in FIG. 2A. As discussed above, when the switch or switches are opened to discontinue service due to non-payment, safety reasons or the like, sometimes the meter is unlawfully bypassed as discussed above and illustrated in FIG. 2B. As illustrated in FIG. 2B, although the switch remains open, a cable has been used to connect the line side to the load side so that the load side can still consume electricity, but the customer will not be charged, as the meter has been bypassed. It will be understood that although FIGS. 2A and 2B only illustrate a single switch, multiple switches may be present depending on the type of device without departing from the scope of the present inventive concept.

Referring again to FIG. 1, operations for detecting a bypass in accordance with embodiments discussed herein begin at block 110 by determining if a switch or switches between a line side and load side of a meter has been opened from a remote location (block 110). For example, as discussed above, meters are available with an integrated remote disconnect switch (RD). The disconnect switch can be opened or closed remotely via, for example, radio frequency (RF) message commands sent to the meter. It will be understood that embodiments discussed herein are not limited to RF communication between the meter and the remote location (utility), other types of communication may be used without departing from the scope of the present inventive concept.

If is determined that a disconnect switch associated with a meter is opened intentionally by the operator (block 110), for example, the utility, "electrical characteristics" may be monitored on both the line side and the load side of the meter. For example, in some embodiments, the voltage value present on the line side of the meter (VLine—FIG. 2A) and the voltage value present on the load side of the meter (VLoad—FIG. 2A) are monitored (block 120). However, embodiments of the present inventive concept art not limited to this configuration. For example, "electrical characteristics" may include voltages, currents or a combination thereof without departing from the scope of the present inventive concept. If, on the other hand, it is determined that a switch has not been opened, operations remain at block 110 until it is determined that a switch has been opened and the proceed to block 120.

Figure 3:
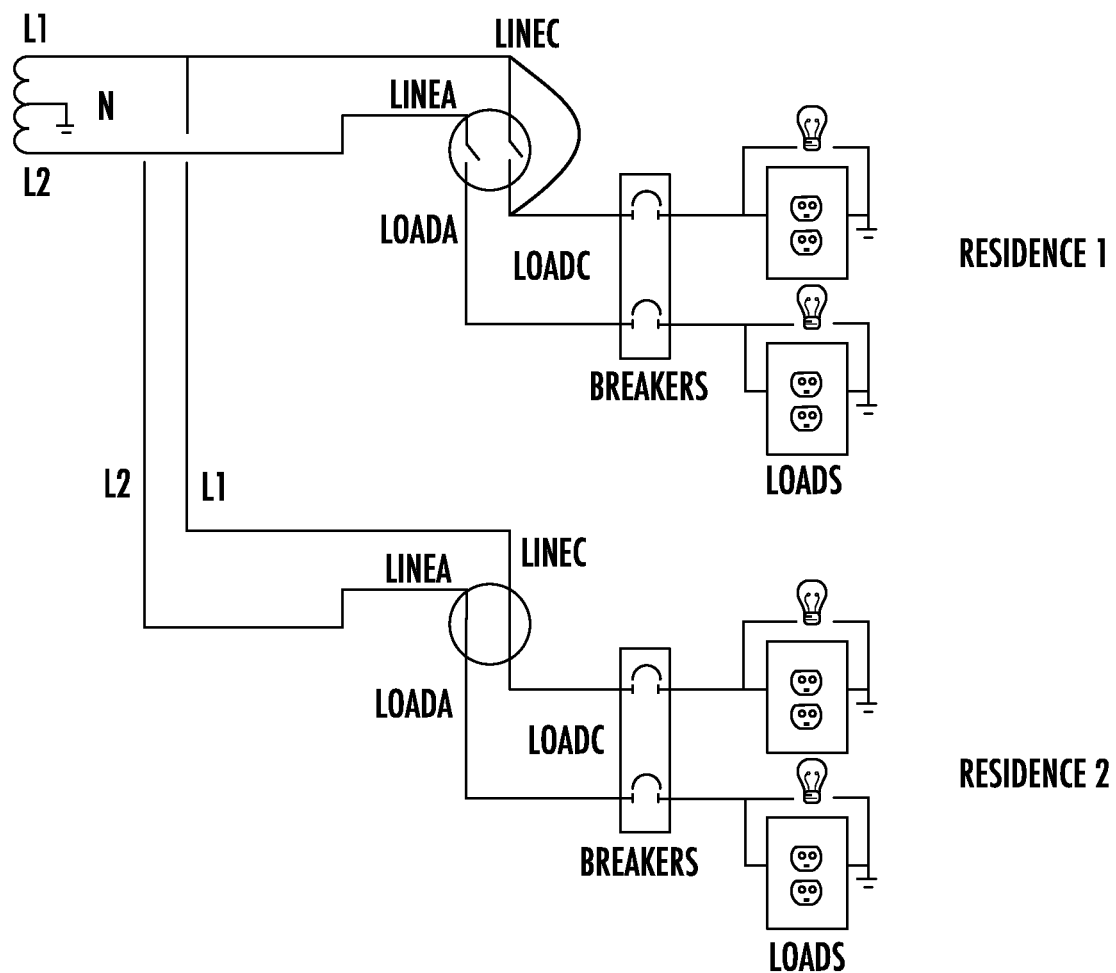
FIG. 3 is a diagram illustrating an example of an illegal bypass in accordance with some embodiments of the present inventive concept.
Figure 4:
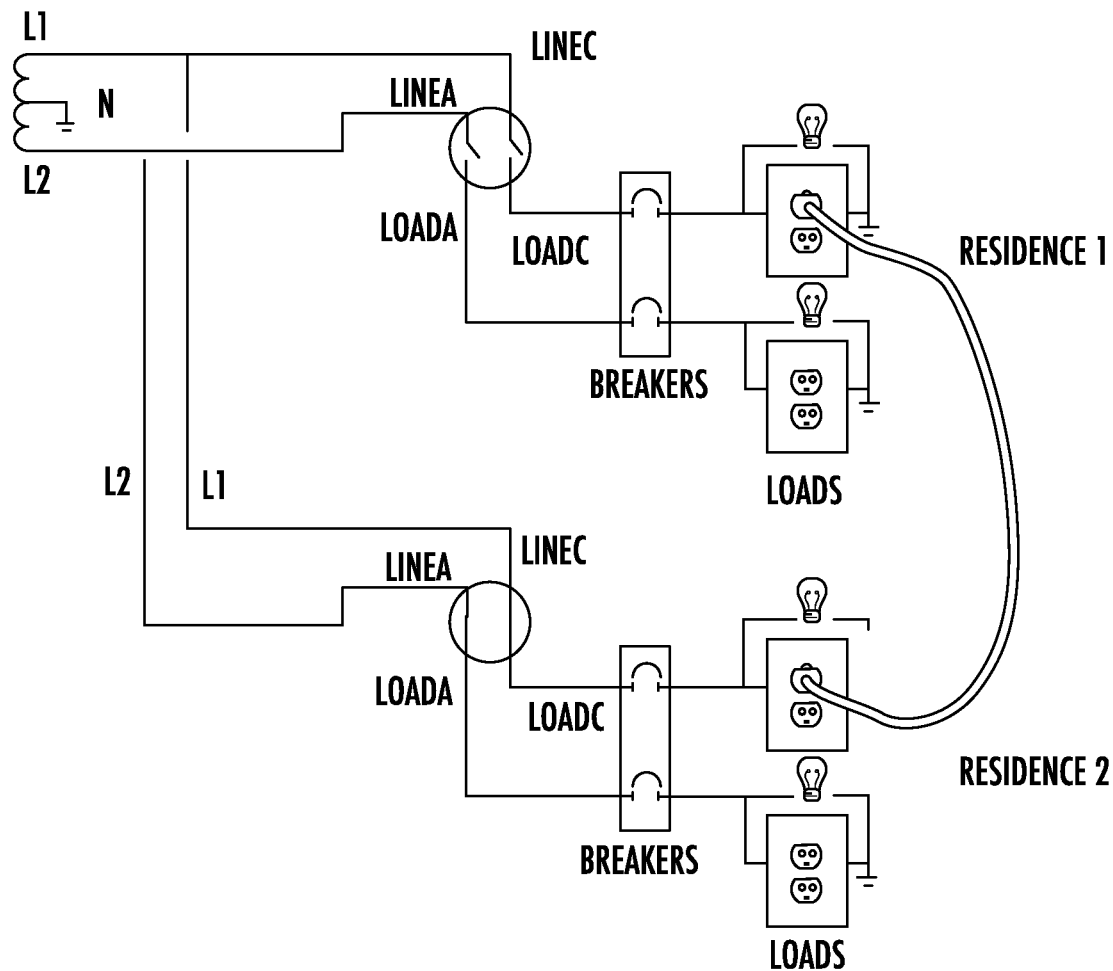
FIG. 4 is a diagram illustrating an example of an illegal bypass in accordance with some embodiments of the present inventive concept.

The monitored voltages VLine and VLoad may provide insight into the state of the meter (block 130). As used herein, the "state of meter" refers generally to whether or not the meter is being bypassed when the switch or switches have been opened from a remote location. For example, in some embodiments, an algorithm may be applied to the monitored voltages. Using these voltages, the meter can determine a state of the meter. For example, the states of the meter may indicate no load (open); load side voltage present indicating use of a generator or other non-synchronous energy generator; and a bypass condition representing a simple bypassing of the line side to load side of a meter within a single customer facility (residence) (VLoad is equal to VLine—FIG. 3) or of the line side to energy from other positions off of the same transformer, one residence is using electricity from a second residence sharing a single transformer as illustrated in FIG. 4. Meters or devices associated with the meters in accordance with embodiments of the present inventive concept are configured to perform the algorithm so that the states of the meter may be determined.

It will be understood that the states of the meter discussed above are provided as examples only and embodiments of the present inventive concept may determine other states of the meter without departing from the scope of the present inventive concept. In essence any condition that indicates a usage of electricity in conflict with the logged state of the meter may be monitored and considered a "state of the meter."

In some embodiments, when the relay is legitimately closed, a bypass cannot be detected. For example, if the relay is closed using firmware (i.e., remotely) and then manually opened and bypassed, in some embodiments a bypass may not be detected until an event triggers an "open relay" command. However, in embodiments where a mechanism is introduced to verify the operation of the relay these capabilities may be possible.

Test results for powering a meter with an extension cord from the neighbor's house (FIG. 4) are provided in the table of FIG. 5. These results are provided for example only and do not limit embodiments of the present inventive concept.

Operations discussed above with respect to FIG. 1 may be performed by a bypass detection module (640—FIG. 6) that is configured to receive voltages, for example, VLine and VLoad, and perform operations associated with algorithms discussed above. This bypass detection module 640 may be included in a meter or a remote device without departing from the scope of the present inventive concept.

An example of detection of an unlawful bypass of an open switch in a meter will now be discussed with respect to the Figures. When it is determined that a switch has been deliberately opened remotely (block 110), the state of the switch is then monitored using the line and load voltages (block 120). In particular, the voltages of the line side and the load side of the meter are periodically measured. If these two voltages are substantially similar, this may be an indication that the open switch is being bypassed. For example, the switch may be bypassed by simply connecting the line side and the load side as shown in FIGS. 2B and 3. As used herein, "substantially similar" may indicate that the voltages are within about twenty percent of each other's value. Once it is determined that the line side and load side voltages are substantially similar, the line side and load side voltages are closely monitored for a plurality of cycles. For example, in some embodiments, the voltages may be monitored for at least four cycles. If the voltages remain within twenty percent of each other for four cycles, it may be determined that the switch is being bypassed unlawfully (state of the meter, block 130).

As discussed above, voltages are monitored on both the line side of the meter and the load side of the meter (block 120, FIG. 1). Anomalies are recorded and observed. Based on this observation, a state of the meter, for example, the meter has been bypassed, is determined. In particular, in some embodiments an unlawful bypass of a meter may be detected based observation of a voltage that is equal to a reference voltage, or slightly different/above the reference voltage, but below an expected threshold. This threshold may be a design choice. In some embodiments, an anomaly in the voltage (voltage below an expected threshold) on the load side of the relay (switch) is indicative of an unlawful bypass. In particular, once the switch is opened, the voltages on the load side and the line side may be monitored. In practice, there is typically a low voltage floating on the load side when the RD switch is open, which is induced via the load side wiring (for example, house wiring). A bridge from line to load will shunt this floating voltage near zero, which is not typical, allowing detection of an unlawful bridge. The electronics design of the meter can also be designed to create a small floating voltage on the load side in an open state for the same purpose. Thus, if the voltage is less than an expected threshold, or otherwise suspect, on the load side this may also be indication that the meter has been unlawfully bypassed.

Figure 6:
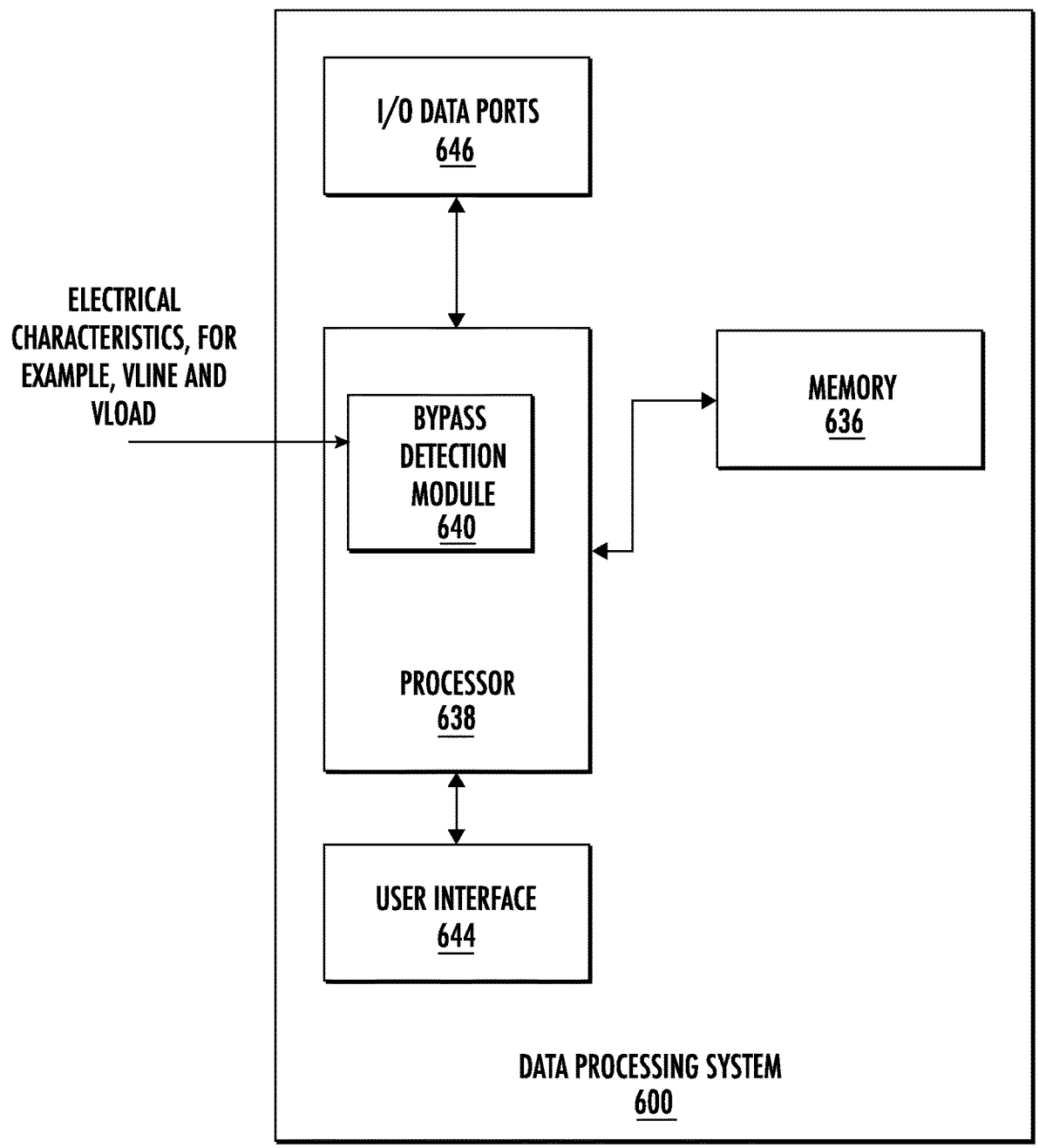
FIG. 6 is a block diagram illustrating a basic data processing system that can be used in accordance with some embodiments of the present inventive concept.

Referring now to FIG. 6, an exemplary embodiment of a data processing system 600 suitable for use in accordance with some embodiments of the present inventive concept will be discussed. For example, the data processing system 600 may be provided at the meter, at the remote location or both without departing from the scope of the present inventive concept. As illustrated in FIG. 6, the data processing system 600 includes a user interface 644 such as a display, a keyboard, keypad, touchpad or the like, I/O data ports 646 and a memory 636 that communicates with a processor 638. The I/O data ports 546 can be used to transfer information between the data processing system 600 and another computer system or a network. These components may be conventional components, such as those used in many conventional data processing systems, which may be configured to operate as described herein. This data processing system 600 may be included any type of computing device without departing from the scope of the present inventive concept.

As briefly discussed above, embodiments of the present inventive concept provide improved methods for detecting an unlawful bypass of a meter. These methods may improve safety as well as provide a cost savings to the utility.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), microcontroller or graphics processing unit.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed example embodiments of the inventive concept. Although specific terms are employed, they are used in a generic and descriptive sense only and not for purposes of limitation, the scope of the inventive concept being defined by the following claims.

What is claimed is:

1. A bypass detection module associated with a device, the bypass detection module being configured to:
   determine if one or more switches have been opened to remove service from a customer;
   monitor electrical characteristic associated with both a line side of the device and a load side of the device responsive to determining that one or more of the one or more switches have been opened to remove service from the customer,
   wherein the monitored electric characteristics are voltages, and wherein the bypass detection module is further configured to monitor voltages associated with both the line side of the device (VLine) and the load side of the device (VLoad) responsive to determining that one or more of the one or more switches have been opened to remove service from the customer; and determine a state of the device based on the monitored voltages, wherein the bypass detection module is further configured to provide an indication of an unlawful bypass as the state of the device if it has been determined that one of or more of the one or more switches have been opened to remove service from the customer and the VLine is substantially equal to the VLoad over a plurality of cycles.

2. The bypass detection module of claim 1, wherein substantially equal comprises the VLine and the VLoad being within twenty percent of one another.

3. The bypass detection module of claim 1, wherein the plurality of cycles comprises at least four cycles.

4. The bypass detection module of claim 1, wherein device comprises an electric meter.

5. A meter comprising:
a bypass detection module associated with the meter, the bypass detection module being configured to:
determine if one or more switches have been opened to remove service from a customer;
monitor electrical characteristics associated with both a line side of the meter and a load side of the meter responsive to determining that one or more of the one or more switches have been opened to remove service from the customer, wherein the monitored electric characteristics are voltages and wherein the bypass detection module is further configured to monitor voltages associated with both the line side of the meter (VLine) and a load side of the meter (VLoad) responsive to determining that one or more of the one or more switches have been opened to remove service from the customer; and
determine a state of the meter based on the monitored voltages,
wherein the bypass detection module is further configured to provide an indication of an unlawful bypass as the state of the meter if it has been determined that one or more of the one or more switches have been opened to remove service from the customer and the VLine is substantially equal to the VLoad over a plurality of cycles.

6. The meter of claim 5, wherein substantially equal comprises a line side voltage and a load side voltage being within twenty percent of one another.

7. The meter of claim 5, wherein the plurality of cycles comprises at least four cycles.

8. A method for detecting a bypass of a device, the method comprising:
determining if one or more switches have been opened to remove service from a customer;
monitoring electrical characteristics associated with both a line side of the device and a load side of the device responsive to determining that one or more of the one or more switches have been opened to remove service from the customer, wherein the monitored electric characteristics are voltages and wherein the method further comprises monitoring voltages associated with both the line side of the device (VLine) and the load side of the device (VLoad) responsive to determining that one or more of the one or more switches have been opened to remove service from the customer; and
determining a state of the device based on the monitored voltages,
wherein the method further comprises providing an indication of an unlawful bypass as the state of the device if it has been determined that one or more of the one or more switches have been opened to remove service from the customer and the VLine is substantially equal to the VLoad over a plurality of cycles; and
wherein at least one of the determining if one or more of the one or more switches have been opened, monitoring and determining a state of the device are performed by at least one processor.

9. The method of claim 8, wherein substantially equal comprises a line side voltage and a load side voltage being within twenty percent of one another.

10. The method of claim 8, wherein the plurality of cycles comprises at least four cycles.

11. The method of claim 8, wherein the device comprises an electric meter.

* * * * *

UNITED STATES PATENT AND TRADEMARK OFFICE
CERTIFICATE OF CORRECTION

| | | |
|---|---|---|
| PATENT NO. | : 11,385,268 B2 | Page 1 of 1 |
| APPLICATION NO. | : 16/809867 | |
| DATED | : July 12, 2022 | |
| INVENTOR(S) | : Curry et al. | |

It is certified that error appears in the above-identified patent and that said Letters Patent is hereby corrected as shown below:

In the Claims

Column 9, Claim 1, Line 5: Please correct "that one of or more" to read -- that one or more --

Signed and Sealed this
Twentieth Day of September, 2022

*Katherine Kelly Vidal*

Katherine Kelly Vidal
*Director of the United States Patent and Trademark Office*